(12) United States Patent
Huang et al.

(10) Patent No.: US 9,960,137 B1
(45) Date of Patent: May 1, 2018

(54) SEMICONDUCTOR DEVICE PACKAGE AND METHOD FOR FORMING THE SAME

(71) Applicant: Advanced Semiconductor Engineering, Inc., Kaohsiung (TW)

(72) Inventors: Chun-Chin Huang, Kaohsiung (TW); Yung I. Yeh, Kaohsiung (TW); Che-Ming Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/340,803

(22) Filed: Nov. 1, 2016

(51) Int. Cl.
*H01L 23/48* (2006.01)
*H01L 23/00* (2006.01)

(52) U.S. Cl.
CPC ............. *H01L 24/13* (2013.01); *H01L 24/03* (2013.01); *H01L 24/05* (2013.01); *H01L 24/11* (2013.01); *H01L 24/14* (2013.01); *H01L 24/16* (2013.01); *H01L 2224/0362* (2013.01); *H01L 2224/0401* (2013.01); *H01L 2224/11462* (2013.01); *H01L 2224/13014* (2013.01); *H01L 2224/13016* (2013.01); *H01L 2224/13026* (2013.01); *H01L 2224/13083* (2013.01); *H01L 2224/13147* (2013.01); *H01L 2224/13155* (2013.01); *H01L 2224/14051* (2013.01); *H01L 2224/16221* (2013.01); *H01L 2924/014* (2013.01); *H01L 2924/3511* (2013.01)

(58) Field of Classification Search
CPC ......... H01L 24/13; H01L 24/03; H01L 24/05; H01L 24/11; H01L 24/14; H01L 24/16; H01L 2224/0362; H01L 2224/0401; H01L 2224/11462; H01L 2224/13014; H01L 2224/13016; H01L 2224/13026; H01L 2224/13083; H01L 2224/13147; H01L 2224/13155; H01L 2224/14051; H01L 2224/16221; H01L 2924/014; H01L 2924/3511
USPC ........................................................ 257/737
See application file for complete search history.

(56) References Cited

U.S. PATENT DOCUMENTS

| 2007/0092396 | A1* | 4/2007 | Huang | B23K 35/262 420/557 |
| 2011/0233761 | A1* | 9/2011 | Hwang | H01L 24/03 257/737 |
| 2011/0241228 | A1 | 10/2011 | Enomoto et al. | |
| 2013/0270699 | A1* | 10/2013 | Kuo | H01L 23/49816 257/738 |
| 2014/0061897 | A1* | 3/2014 | Lin | H01L 24/06 257/737 |

* cited by examiner

*Primary Examiner* — Tu-Tu Ho
(74) *Attorney, Agent, or Firm* — Foley & Lardner LLP; Cliff Z. Liu

(57) ABSTRACT

A semiconductor device package ready for assembly includes: a semiconductor substrate; a first under-bump-metallurgy (UBM) layer disposed on the semiconductor substrate; a first conductive pillar disposed on the first UBM layer; and a second conductive pillar disposed on the first conductive pillar. A material of the first conductive pillar is different from a material of the second conductive pillar, and the material of the second conductive pillar includes an antioxidant.

17 Claims, 14 Drawing Sheets

SEMICONDUCTOR DEVICE PACKAGE AND METHOD FOR FORMING THE SAME

BACKGROUND

To allow more components to be integrated into a semiconductor chip or a semiconductor device package, one approach is the adoption of flip chip structures. For a flip chip structure, a first wafer is flipped and attached onto a second wafer by conductive bumps. Solder is commonly used to assemble a semiconductor device package. The solder, which is disposed on a pad or copper pillar of a first wafer, is reflowed before attaching to another pad or copper pillar of a second wafer. Substrate and components may be subject to warpage during the reflow operation, which may damage a solder joint. Moreover, a hemispherical shaped solder bump (which is formed by the reflow operation) may also contribute to the warpage of the whole semiconductor device package. Such phenomenon can be particularly noticeable at edges of the package, where the warpage is more intense. The warpage may cause the substrate to bow, warp or crack. Accordingly, there is a need to provide an improved semiconductor device package to solve the above problem.

SUMMARY

In some embodiments, a semiconductor device package ready for assembly is disclosed. The semiconductor device package comprises a semiconductor substrate, a first under-bump-metallurgy (UBM) layer, a first conductive pillar, and a second conductive pillar. The first UBM layer is disposed on the semiconductor substrate. The first conductive pillar is disposed on the first UBM layer. The second conductive pillar is disposed on the first conductive pillar. A material of the first conductive pillar is different from a material of the second conductive pillar, and the second conductive pillar is ready to be assembled to an external device. In some embodiments, the material of the second conductive pillar includes an antioxidant.

In some embodiments, a semiconductor packaging assembly is disclosed. The semiconductor packaging assembly comprises a first semiconductor substrate, a first UBM layer, a first conductive pillar, a second conductive pillar, a second UBM layer, a third conductive pillar, a fourth conductive pillar, a second semiconductor substrate, a first conductive pad, and a second conductive pad. The first UBM layer is disposed on the first semiconductor substrate. The first conductive pillar is disposed on the first UBM layer. The second conductive pillar is disposed on the first conductive pillar, where a material of the first conductive pillar is different from a material of the second conductive pillar. The second UBM layer is disposed on the first semiconductor substrate. The third conductive pillar is disposed on the second UBM layer. The fourth conductive pillar is disposed on the third conductive pillar, where a material of the third conductive pillar is different from a material of the fourth conductive pillar. The first conductive pad is disposed on the second semiconductor substrate, and the second conductive pillar is bonded to the first conductive pad. The second conductive pad is disposed on the second semiconductor substrate, and the fourth conductive pillar is bonded to the second conductive pad. A volume of the material of the second conductive pillar is different from a volume of the material of the fourth conductive pillar.

In some embodiments, a method of forming a semiconductor device package ready for assembly is disclosed. The method comprises: forming a first UBM layer on a semiconductor substrate; forming a first conductive pillar on the first UBM layer; and forming a second conductive pillar on the first conductive pillar. A material of the first conductive pillar is different from a material of the second conductive pillar, and the second conductive pillar is ready to be assembled with a first conductive pad.

BRIEF DESCRIPTION OF THE DRAWINGS

Aspects of some embodiments of the present disclosure are best understood from the following detailed description when read with the accompanying figures. It is noted that various features may not be drawn to scale, and dimensions of the various features may be arbitrarily increased or reduced for clarity of discussion.

DETAILED DESCRIPTION

Figure 1:
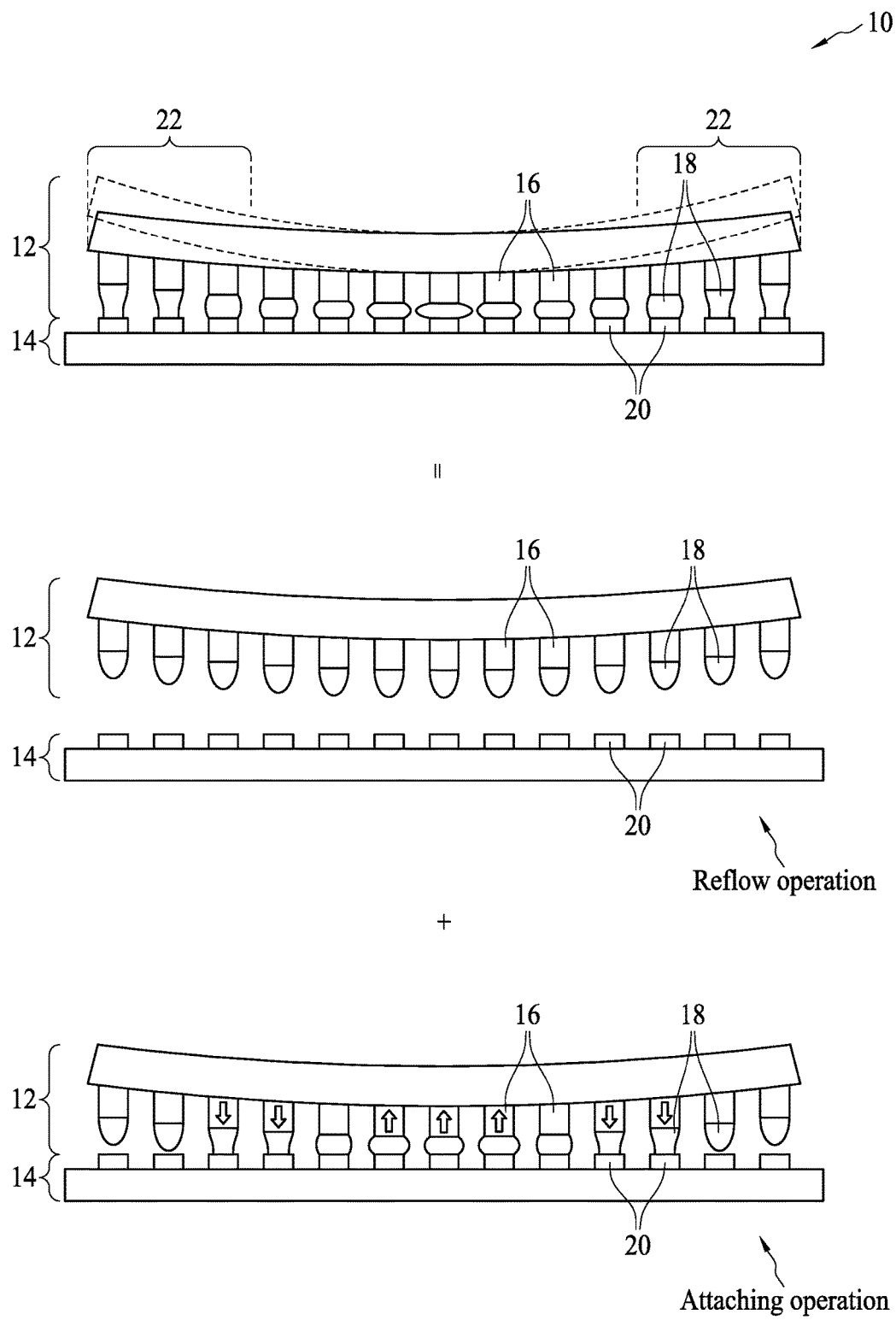
FIG. 1 is a cross-sectional diagram illustrating a semiconductor packaging assembly.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "higher," "left," "right" and the like, may be used herein for ease of description to describe one element or feature's relationship to another element(s) or feature(s) as illustrated in the figures. The spatially relative terms are intended to encompass different orientations of a device in use or operation in addition to the orientation depicted in the figures. The device may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a cross-sectional diagram illustrating a semiconductor packaging assembly 10. The semiconductor packaging assembly 10 comprises a semiconductor device package 12 and a semiconductor substrate 14. The semiconductor device package 12 is arranged to bond to the semiconductor substrate 14 via a plurality of conductive bumps 16 and a plurality of solders 18. During packaging, the semiconductor device package 12 is reflowed and flipped for attaching the solders 18 onto conductive pads 20 of the semiconductor substrate 14. However, during the reflow operation, a high temperature may induce warpage of the semiconductor device package 12. The warpage of the semiconductor device package 12 may cause a relatively high risk of solder joint damage at an edge 22 of the semiconductor device package 12. As shown in FIG. 1, the solders 18 at the edge 22 of the semiconductor device package 12 are pulled by a force of the warped semiconductor device package 12. As a result, the shapes of the solders 18 at the edge 22 of the semiconductor device package 12 are deformed into elongated shape. The elongated shape has a relatively small circumference in the middle portion, and may have a concave profile. Such solder 18 may have a relatively high risk of joint failure because the middle portion of the solder 18 may be fragile. Moreover, the elongated shape of the solder 18 also has a relatively high resistance, which may affect reliability or signal integrity of an integrated circuit formed in the semiconductor device package 12. The joining issue of the solder 18 is worsened when the semiconductor device package 12 is relatively large. In FIG. 1, the formation of the semiconductor packaging assembly 10 may be performed in two operations. The first operation is the reflow operation and the second operation is an attaching operation. During the reflow operation, the semiconductor device package 12 is heated to melt the solders 18 to be attached to the conductive pads 20 of the semiconductor substrate 14. The high temperature induces warpage of the semiconductor device package 12. During the attaching operation, the solders 18 are aligned and then attached to the conductive pads 20 of the semiconductor substrate 14. When the semiconductor device package 12 is assembled to the semiconductor substrate 14, the solders 18 in the middle portion and around the middle portion of the semiconductor device package 12 are attached to the corresponding conductive pads 20. However, the solders 18 at the edge 22 of the semiconductor device package 12 may suspend on the corresponding conductive pads 20. The solders 18 at the edge 22 of the semiconductor device package 12 may be attached to the corresponding conductive pads 20 by pushing the semiconductor device package 12 toward the semiconductor substrate 14. When the solders 18 are attached to the corresponding conductive pads 20, the solders 18 may further affect the warpage of the semiconductor device package 12 because forces of the solders 18 may be different. For example, the solders 18 at the edge 22 of the semiconductor device package 12 may join to the corresponding conductive pads 20 with pull forces. The solders 18 around the middle of the semiconductor device package 12 may join to the corresponding conductive pads 20 at balanced forces. The solders 18 in the middle of the semiconductor device package 12 may join to the corresponding conductive pads 20 with push forces. Accordingly, the semiconductor packaging assembly 10 has a final warpage after attaching the semiconductor device package 12 to the semiconductor substrate 14. In addition, if the warpage of the semiconductor device package 12 exceeds acceptable thresholds, the solders 18 at the edge 22 of the semiconductor device package 12 may just contact or remain unattached on the corresponding conductive pads 20.

Figure 2:
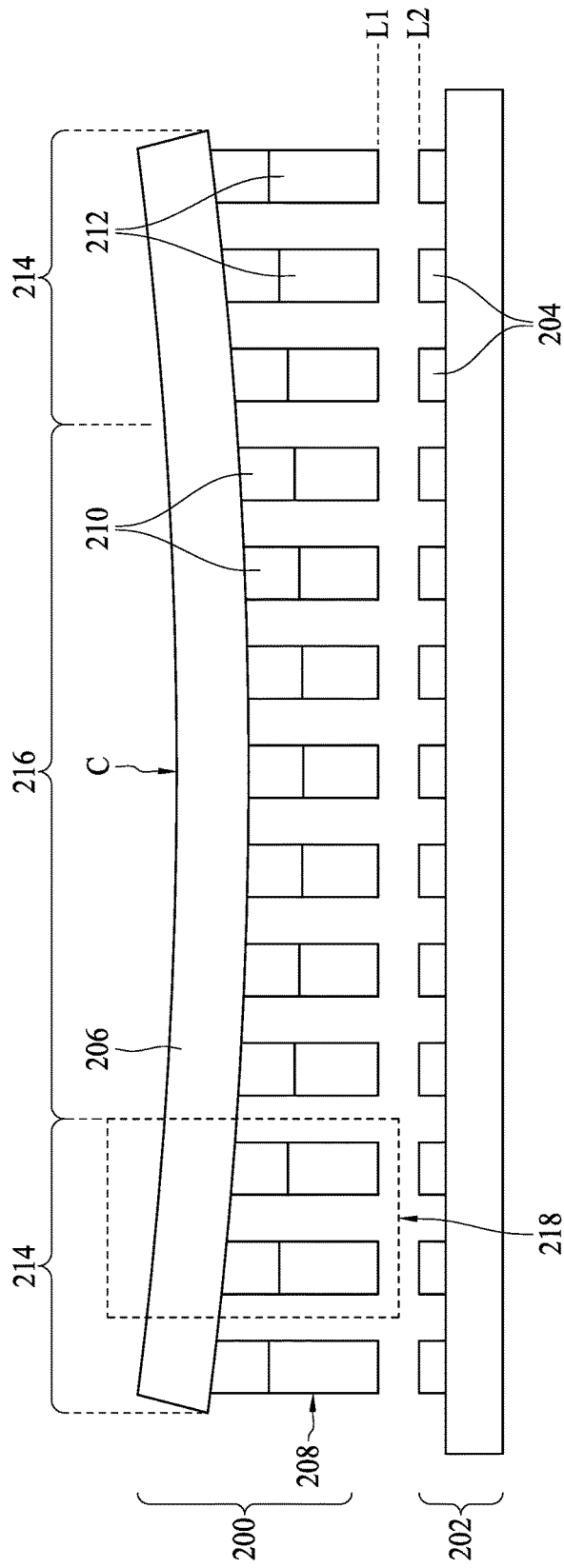
FIG. 2 is a cross-sectional diagram illustrating a semiconductor device package in accordance with some embodiments.

According to the description above, the reflow operation is a main reason that warpage is induced to the semiconductor device package 12. Therefore, a semiconductor device package without undergoing the reflow operation is proposed. The semiconductor device package also has a relatively high reliability in joining with a semiconductor substrate. FIG. 2 is a cross-sectional diagram illustrating a semiconductor device package 200 in accordance with some embodiments. The semiconductor device package 200 is ready for assembly without undergoing a reflow operation. More specifically, the semiconductor device package 200 is ready for assembly with a semiconductor substrate 202 comprising a plurality of conductive pads 204 formed thereon. The semiconductor substrate 202 may be regarded as an external device of the semiconductor device package 200. According to some embodiments, the semiconductor device package 200 and the semiconductor substrate 202 are wafer-level devices. Integrated circuits may be formed in either, or both, of the semiconductor device package 200 and the semiconductor substrate 202. The semiconductor device package 200 comprises a semiconductor substrate 206 and a plurality of conductive structures 208. The conductive structures 208 are disposed on the semiconductor substrate 206. Before the semiconductor device package 200 is assembled with the semiconductor substrate 202, the semiconductor substrate 206 may have a wafer warpage. The conductive structures 208 are designed to have adaptive or varying heights to compensate the warpage of the semiconductor substrate 206 such that the conductive structures 208 can attach to the conductive pads 204 respectively. According to some embodiments, top surfaces of the conductive structures 208 are designed to have substantially the same level L1. According to some embodiments, it is assumed that the semiconductor substrate 202 has no noticeable warpage, and the conductive pads 204 have substantially the same height. Therefore, top surfaces of the conductive pads 204 are designed to have substantially the same level L2. In addition, a reflow operation is omitted for the conductive structures 208 because the conductive structures 208 are arranged to be ready for attaching to the corresponding conductive pads 204 of the semiconductor substrate 202. Conventionally, a semiconductor device package may be heated to a temperature of about 240-260° C. to melt solder bumps during the reflow operation, and the semiconductor device package may be warped by the high temperature. In the illustrated embodiments, a reflow operation is omitted, and thus the warpage issue of the semiconductor device package 200 due to the reflow operation may be solved.

In addition, a material of the conductive structures 208 may comprise tin-silver (SnAg) homogeneously doped with an antioxidant to suppress the formation of stannic oxide.

According to some embodiments, the conductive structures 208 may also be doped with surfactants, wetting agents, dispersing agents, or a combination of two or more of the foregoing to further reduce the formation of stannic oxide. By reducing the formation of stannic oxide in such manner, a reflow operation may be omitted.

According to some embodiments, each of the conductive structures 208 is designed to be a pillar with a predetermined height and with a substantially planar end surface. Therefore, a cross-sectional shape of the conductive structures 208 may be rectangular or square-shaped, or may take on other regular or irregular shapes. Moreover, each of the conductive structures 208 comprises a first conductive pillar 210 and a second conductive pillar 212. The second conductive pillar 212 is disposed on the first conductive pillar 210. According to some embodiments, the first conductive pillar 210 and the second conductive pillar 212 are composed of different materials. For example, the first conductive pillar 210 is a metal pillar such as a copper pillar, and the second conductive pillar 212 is a solder pillar doped with an antioxidant. Furthermore, the heights of the first conductive pillars 210 are substantially the same. However, the heights of the second conductive pillars 212 are varied depending on the warpage of the semiconductor substrate 206. For example, the heights of the second conductive pillars 212 on an edge portion 214 of the semiconductor substrate 206 are greater than the heights of the second conductive pillars 212 on a central portion 216 of the semiconductor substrate 206. This is because, normally, the edge portion 214 has a greater warpage than the central portion 216 of the semiconductor substrate 206. It is noted that the heights of the second conductive pillars 212 can be well-controlled by calculating a curvature of the semiconductor substrate 206 during the manufacturing process. In some embodiments, a center C of the semiconductor substrate 206 has the largest curvature. However, this is not a limitation of the present disclosure. The semiconductor substrate 206 may have the largest curvature at a position other than the center C.

Figure 3:
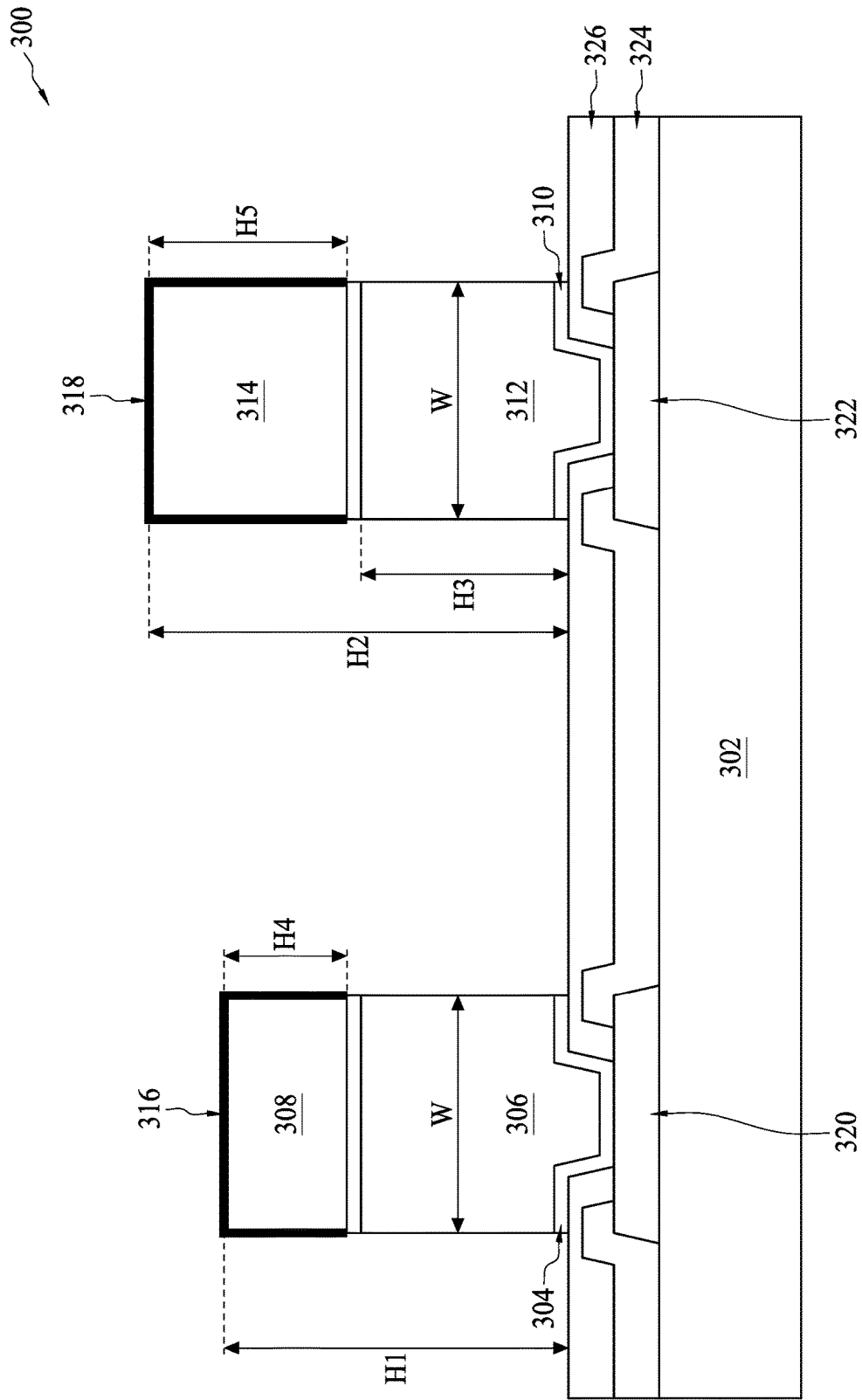
FIG. 3 is a cross-sectional diagram illustrating a portion of a semiconductor device package in accordance with some embodiments.

For the purpose of illustration, a portion 218 of the semiconductor device package 200 is described in detail in FIG. 3. FIG. 3 is a cross-sectional diagram illustrating a portion of a semiconductor device package 300 (e.g., the portion 218 in FIG. 2) in accordance with some embodiments. The semiconductor device package 300 comprises a semiconductor substrate 302, a first under-bump-metallurgy (UBM) layer 304, a first conductive pillar 306, a second conductive pillar 308, a second UBM layer 310, a third conductive pillar 312, and a fourth conductive pillar 314. The first UBM layer 304 is disposed on a first pad 320, which is on a first position of the semiconductor substrate 302. The first conductive pillar 306 is disposed on the first UBM layer 304. The second conductive pillar 308 is disposed on the first conductive pillar 306. The second UBM layer 310 is disposed on a second pad 322, which is on a second position of the semiconductor substrate 302. A passivation layer 324 is disposed on the semiconductor substrate 302, and an insulation layer 326 is disposed on the passivation layer 324 as shown in FIG. 3.

The third conductive pillar 312 is disposed on the second UBM layer 310. The fourth conductive pillar 314 is disposed on the third conductive pillar 312. According to some embodiments, the first position is closer to a center (e.g., the center C as shown in FIG. 2) of the semiconductor substrate 302 than the second position, where the center has the largest curvature. Therefore, a total height H1 of the first conductive pillar 306 and the second conductive pillar 308 is greater than a total height H2 of the third conductive pillar 312 and the fourth conductive pillar 314. Specifically, the first conductive pillar 306 and the third conductive pillar 312 have substantially the same height H3, the height of the second conductive pillar 308 is H4, the height of the fourth conductive pillar 314 is H5, and H5 is greater than H4.

In addition, the first conductive pillar 306, the second conductive pillar 308, the first UBM layer 304, the second UBM layer 310, the third conductive pillar 312, and the fourth conductive pillar 314 are arranged to have substantially the same circumference. For example, the first conductive pillar 306, the second conductive pillar 308, the first UBM layer 304, the second UBM layer 310, the third conductive pillar 312, and the fourth conductive pillar 314 are designed to be cylindrical with substantially the same circumference. A lateral periphery of the first conductive pillar 306 is arranged to be aligned with a lateral periphery of the second conductive pillar 308. A lateral periphery of the third conductive pillar 312 is arranged to be aligned with a lateral periphery of the fourth conductive pillar 314. Therefore, the first conductive pillar 306, the second conductive pillar 308, the first UBM layer 304, the second UBM layer 310, the third conductive pillar 312, and the fourth conductive pillar 314 have substantially the same width W as shown in FIG. 3. According to some embodiments, the height H4 of the second conductive pillar 308 and/or the height H5 of the fourth conductive pillar 314 may be greater than the width W by at least about 0.65 times. However, this is not a limitation of the present disclosure. The height H4 of the second conductive pillar 308 and/or the height H5 of the fourth conductive pillar 314 may be smaller than about 0.65 times of the width W. Specifically, the heights H4 and H5 can be adaptively adjusted by controlling a solder volume of the second conductive pillar 308 and the fourth conductive pillar 314 during the manufacturing process to compensate the warpage of the semiconductor substrate 302. In some embodiments, the solder volume of the fourth conductive pillar 314 is greater than the solder volume of the second conductive pillar 308, and thus the height H5 is greater than the height H4. For example, the height H5 may be at least about 1.15 times, at least about 1.2 times, or at least about 1.3 times greater than the height H4.

Furthermore, the first conductive pillar 306 and the third conductive pillar 312 are copper pillars, and the second conductive pillar 308 and the fourth conductive pillar 314 are solder pillars doped with an antioxidant element or compound. Specifically, the antioxidant element may suppress the formation of stannic oxide ($SnO_2$) or tin oxide on a surface of a solder pillar if the solder pillar is doped with the antioxidant element. According to some embodiments, a first stannic oxide layer 316 and a second stannic oxide layer 318 may also be formed on surfaces of the second conductive pillar 308 and the fourth conductive pillar 314 respectively. However, thicknesses of the first stannic oxide layer 316 and the second stannic oxide layer 318 are relatively small. For example, the thicknesses of the first stannic oxide layer 316 and the second stannic oxide layer 318 may be less than about 10 nanometer (nm), which is tolerable during the assembling process. This is because the first stannic oxide layer 316 and the second stannic oxide layer 318 can be readily removed by the assembling process, and a reflow process can be omitted. Therefore, even though the first stannic oxide layer 316 and the second stannic oxide layer 318 are formed on the surfaces of the second conductive pillar 308 and the fourth conductive pillar 314 respectively, the second conductive pillar 308 and the fourth conductive pillar 314 still match the assembly criteria of the semiconductor device package 300.

Figure 4:
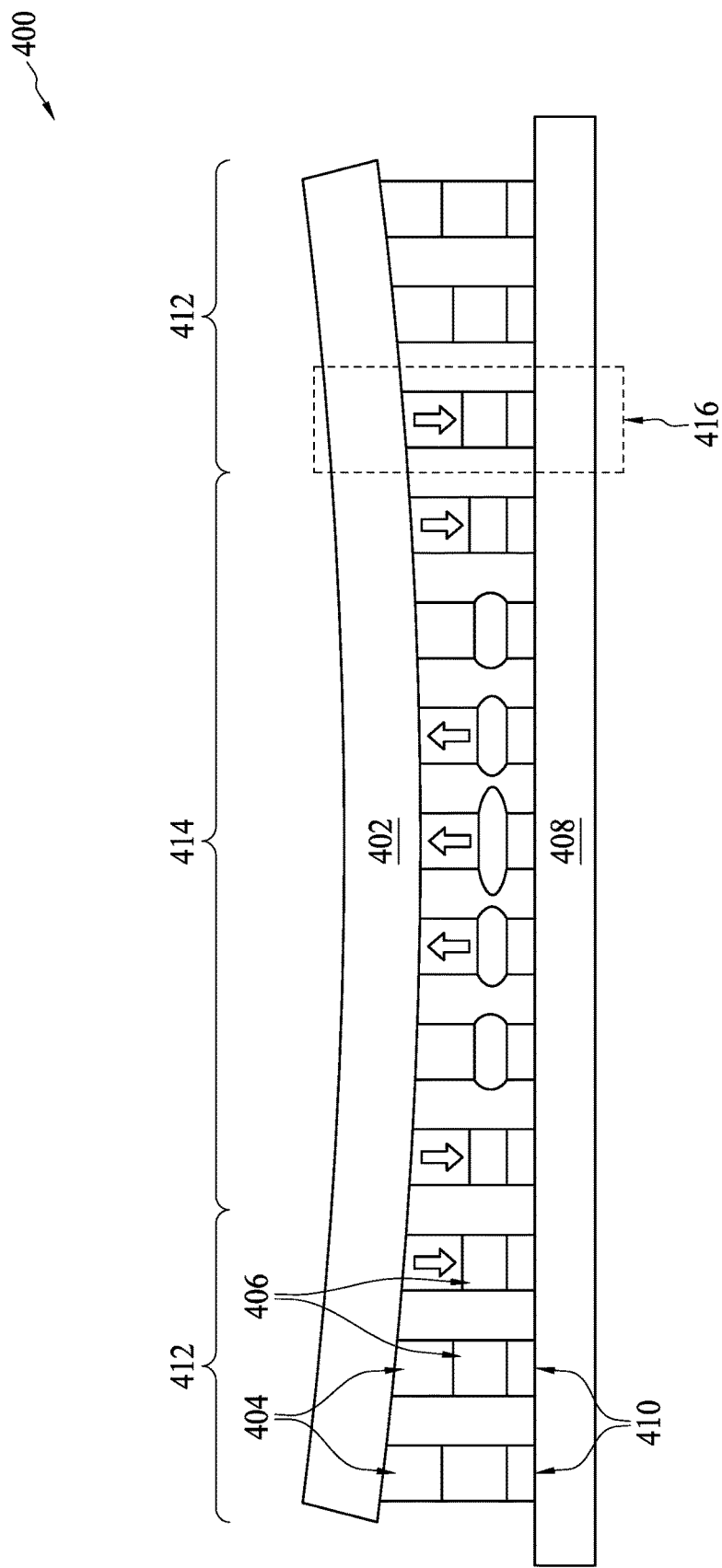
FIG. 4 is a cross-sectional diagram illustrating a semiconductor packaging assembly in accordance with some embodiments.

Referring back to FIG. 2, during the assembly process, the semiconductor device package 200 is flipped and attached to the semiconductor substrate 202 to form a semiconductor packaging assembly. FIG. 4 is a cross-sectional diagram illustrating a semiconductor packaging assembly 400 in accordance with some embodiments. The semiconductor packaging assembly 400 comprises a first semiconductor substrate 402, a plurality of copper pillars 404, a plurality of solder pillars 406, a second semiconductor substrate 408, and a plurality of conductive pads 410. The copper pillars 404 are disposed on a plurality UBM layers (not shown) on the first semiconductor substrate 402. The solder pillars 406 are disposed on the copper pillars 404 respectively. The conductive pads 410 are disposed on the second semiconductor substrate 408. According to some embodiments, the solder pillars 406 are doped with an antioxidant. The copper pillars 404 are arranged to have substantially the same height. The solder pillars 406 are arranged to have different heights to compensate a warpage of the first semiconductor substrate 402. It should be noted that thin stannic oxide layers on surfaces of the solder pillars 406 have been removed during the assembling process. Therefore, there is little or no stannic oxide layer disposed between the solder pillars 406 and the conductive pads 410 of the semiconductor packaging assembly 400.

After the assembling process, all of the solder pillars 406 are joined with the conductive pads 410 respectively, and no solder pillar 406 is suspended on the corresponding conductive pad 410. In addition, at an edge portion 412 of the first semiconductor substrate 402, a cross-sectional shape (e.g., rectangular or square) of the solder pillars 406 can be kept substantially intact, without a concave profile. Therefore, issues of non-contact and solder neck are solved. The solder pillars 406 in a central portion 414 of the first semiconductor substrate 402 may be deformed by the compression between the first semiconductor substrate 402 and the second semiconductor substrate 408. However, in some embodiments, the joining of the deformed solder pillars 406 can be kept at a balanced condition by well designing the heights of the solder pillars 406 at the edge portion 412 of the first semiconductor substrate 402.

Figure 5:
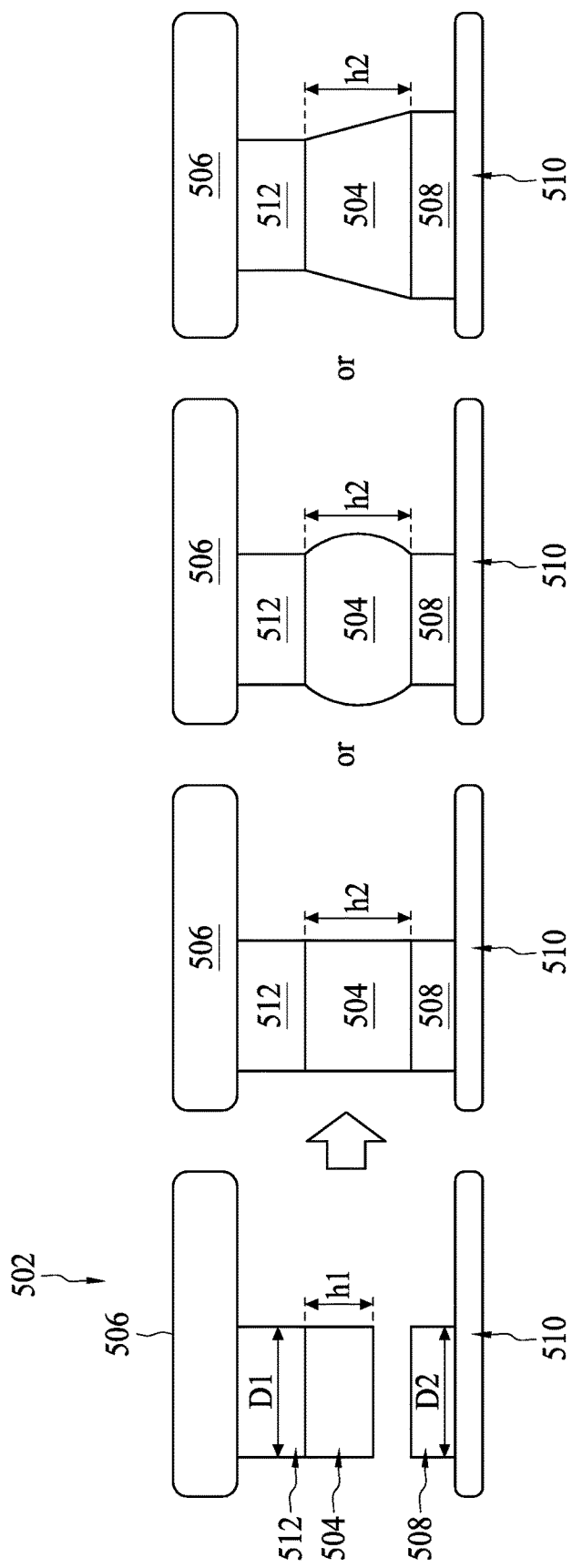
FIG. 5 is a cross-sectional diagram illustrating an assembling process of a portion of a semiconductor packaging assembly in accordance with some embodiments.

FIG. 5 is a cross-sectional diagram illustrating the assembling process of a portion of a semiconductor packaging assembly 502 (e.g., the portion 416 in FIG. 4) in accordance with some embodiments. On the leftmost side of FIG. 5, a solder pillar 504 of a first semiconductor substrate 506 is flipped and aligned with a conductive pad 508 of a second semiconductor substrate 510. The solder pillar 504 is disposed on a copper pillar 512, which is disposed on the first semiconductor substrate 506. In some embodiments, a diameter (or width) D1 of the copper pillar 512, which is substantially equal to a diameter of the solder pillar 504, is substantially equal to a diameter (or width) D2 of the conductive pad 508. The solder pillar 504 is arranged to have a first height h1, which is controlled by a volume of the solder pillar 504. Then, after the assembling process, the solder pillar 504 is joined with the conductive pad 508. After the solder pillar 504 is attached to the conductive pad 508, the solder pillar 504 has a second height h2. The second height h2 may be the same as or different from the first height h1. When the pressure between the first semiconductor substrate 506 and the second semiconductor substrate 510 is a pull force, the second height h2 may be greater than the first height h1, namely the case in the second leftmost of FIG. 5. Although the second height h2 is greater than the first height h1, a cross-sectional shape of the solder pillar 504 is kept substantially as a rectangle or square. The solder pillar 504 is not elongated to form a solder neck. On the other hand, when the pressure between the first semiconductor substrate 506 and the second semiconductor substrate 510 is a push force, the second height h2 may be smaller than the first height h1, and a width of the solder pillar 504 may be greater than D1, namely the case on the second rightmost side of FIG. 5. In addition, the width of the solder pillar 504 may be greater than D1 due to the deformation caused by the compression of the first semiconductor substrate 506 and the second semiconductor substrate 510. However, if the diameter D2 of the conductive pad 508 is greater than the diameter D1 of the solder pillar 504, then the solder pillar 504 may deform into a trapezoid due to a surface tension of the conductive pad 508 after the assembling process. In the rightmost side of FIG. 5, after the solder pillar 504 is attached to the conductive pad 508, a cross-sectional shape of the solder pillar 504 is deformed into a trapezoid. When the pressure between the first semiconductor substrate 506 and the second semiconductor substrate 510 is a pull force, the second height h2 may be greater than the first height h1. Although the second height h2 is greater than the first height h1, the cross-sectional shape of the solder pillar 504 is kept substantially as a trapezoid. The solder pillar 504 is not elongated to form a solder neck.

Figure 6:
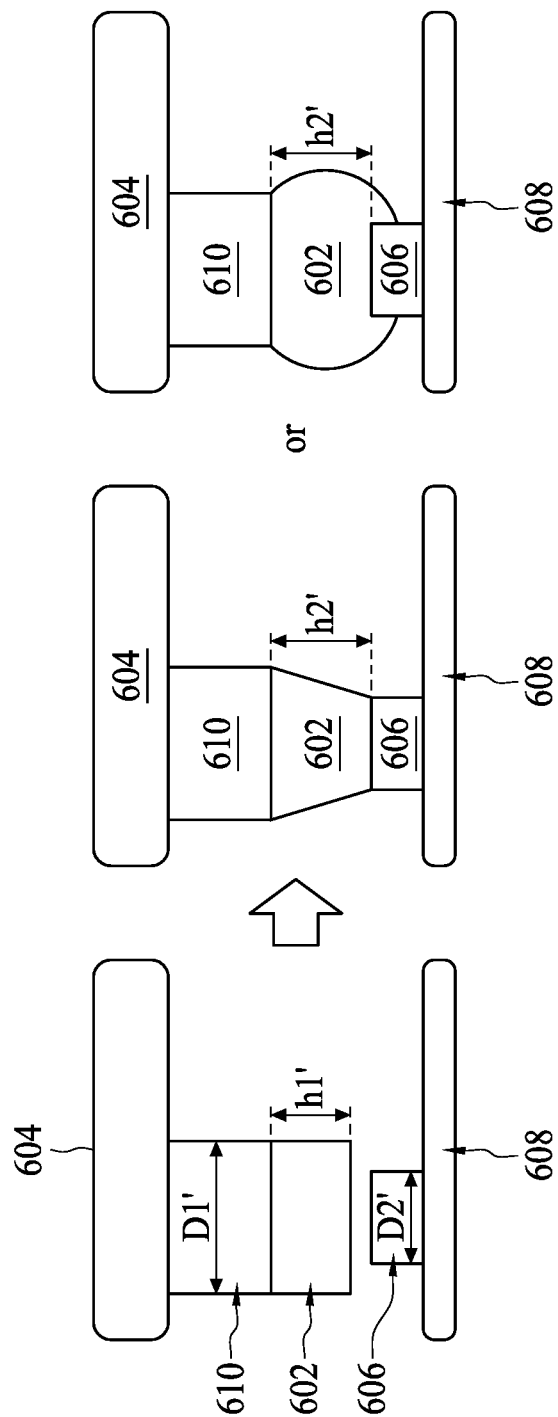
FIG. 6 is a cross-sectional diagram illustrating an assembling process of a portion of a semiconductor packaging assembly in accordance with some embodiments.

According to some embodiments, the diameter D2 of the conductive pad 508 may be smaller than the diameter D1 of the copper pillar 512. FIG. 6 is a cross-sectional diagram illustrating the assembling process of a portion of a semiconductor packaging assembly in accordance with some embodiments. On the left side of FIG. 6, a solder pillar 602 of a first semiconductor substrate 604 is flipped and aligned with a conductive pad 606 of a second semiconductor substrate 608. The solder pillar 602 is disposed on a copper pillar 610, which is disposed on the first semiconductor substrate 604. In some embodiments, a diameter (or width) D1' of the copper pillar 610, which is substantially equal to a diameter of the solder pillar 602, is greater than a diameter (or width) D2' of the conductive pad 606. The solder pillar 602 is arranged to have a first height h1', which is controlled by a volume of the solder pillar 602. Then, after the assembling process, the solder pillar 602 is joined with the conductive pad 606. After the solder pillar 602 is attached to the conductive pad 606, the solder pillar 602 has a second height h2'. The second height h2' may be the same as or different from the first height h1'. As the diameter D1' of the copper pillar 610 is greater than the diameter D2' of the conductive pad 606, a cross-sectional shape of the solder pillar 602 may deform into a trapezoid due to a surface tension as shown in the middle of FIG. 6. When the pressure between the first semiconductor substrate 604 and the second semiconductor substrate 608 is a pull force, the second height h2' may be greater than the first height h1'. Although the second height h2' is greater than the first height h1', the cross-sectional shape of the solder pillar 602 is kept substantially as a trapezoid. The solder pillar 602 is not elongated to form a solder neck. On the other hand, when the pressure between the first semiconductor substrate 604 and the second semiconductor substrate 608 is a push force, the second height h2' may be smaller than the first height h1', and the solder pillar 602 may encapsulate a top portion of the conductive pad 606, namely the case on the right side of FIG. 6. In addition, a widest width of the solder pillar 602 may be greater than D1' due to the deformation caused by the compression of the first semiconductor substrate 604 and the second semiconductor substrate 608.

FIG. 7A to FIG. 7H are cross-sectional views of a portion of a semiconductor device package fabricated at various stages, in accordance with some embodiments of the present disclosure.

Figure 7A:
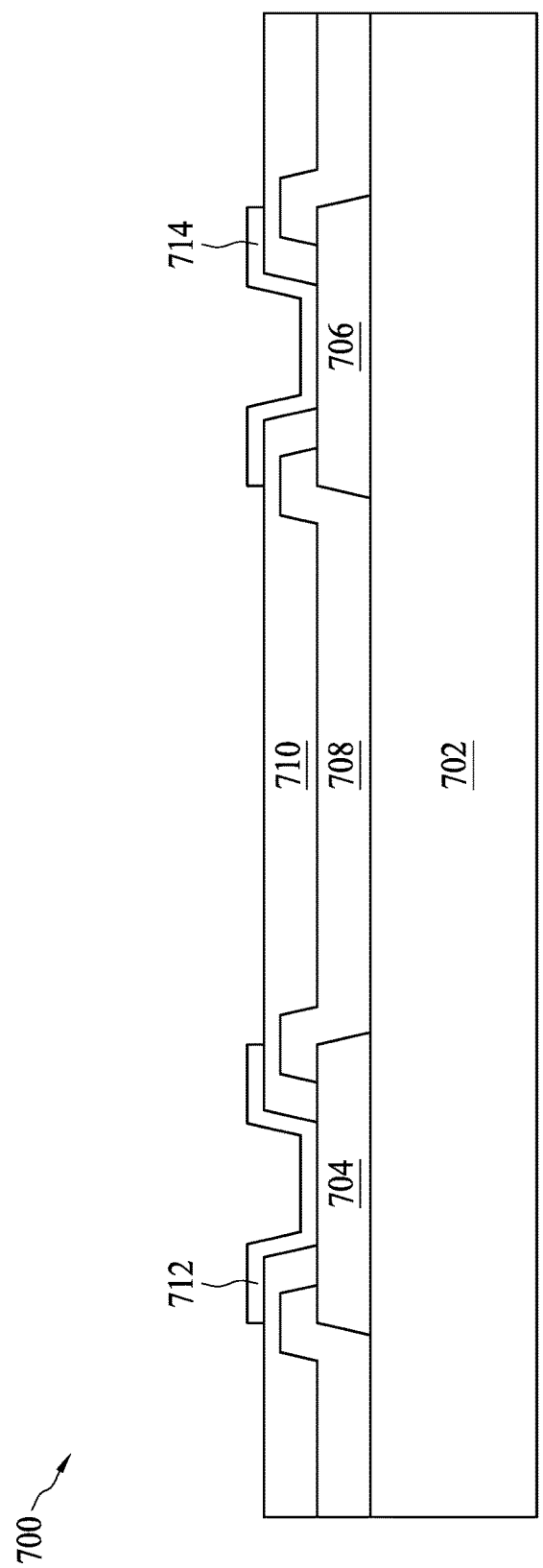
FIG. 7A, FIG. 7B, FIG. 7C, FIG. 7D, FIG. 7E, FIG. 7F, FIG. 7G and FIG. 7H are cross-sectional views of a portion of a semiconductor device package fabricated at various stages, in accordance with some embodiments of the present disclosure.

In FIG. 7A, a semiconductor substrate 700 is provided. The semiconductor substrate 700 comprises a substrate 702, a first pad 704, a second pad 706, a passivation layer 708, an insulation layer 710, a first UBM layer 712, and a second UBM layer 714. The first UBM layer 712 and the second UBM layer 714 are formed on the first pad 704 and the second pad 706 respectively. The substrate 702 may include several dies, each of which has active and passive devices.

Figure 7B:
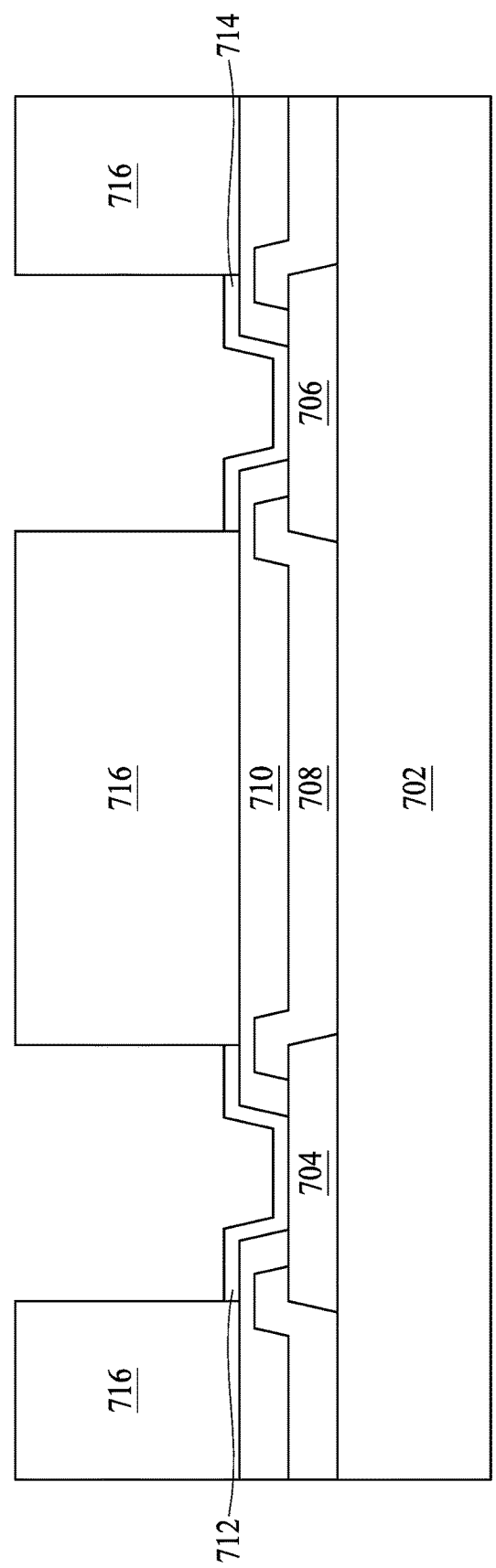

In FIG. 7B, a photoresist pattern 716 is formed on the semiconductor substrate 700. The photoresist pattern 716 is formed by using photolithography, which involves the deposition of a light sensitive material, such as a photoresist. A pattern is transferred from a photomask to the photoresist using light. A portion of the photoresist subjected to light is removed using a solvent, exposing portions of the underlying layer to be patterned. A remainder of the photoresist is removed, leaving behind a patterned layer, namely the photoresist pattern 716. A first trench and a second trench are formed exposing the first UBM layer 712 and the second UBM layer 714 respectively.

Figure 7C:
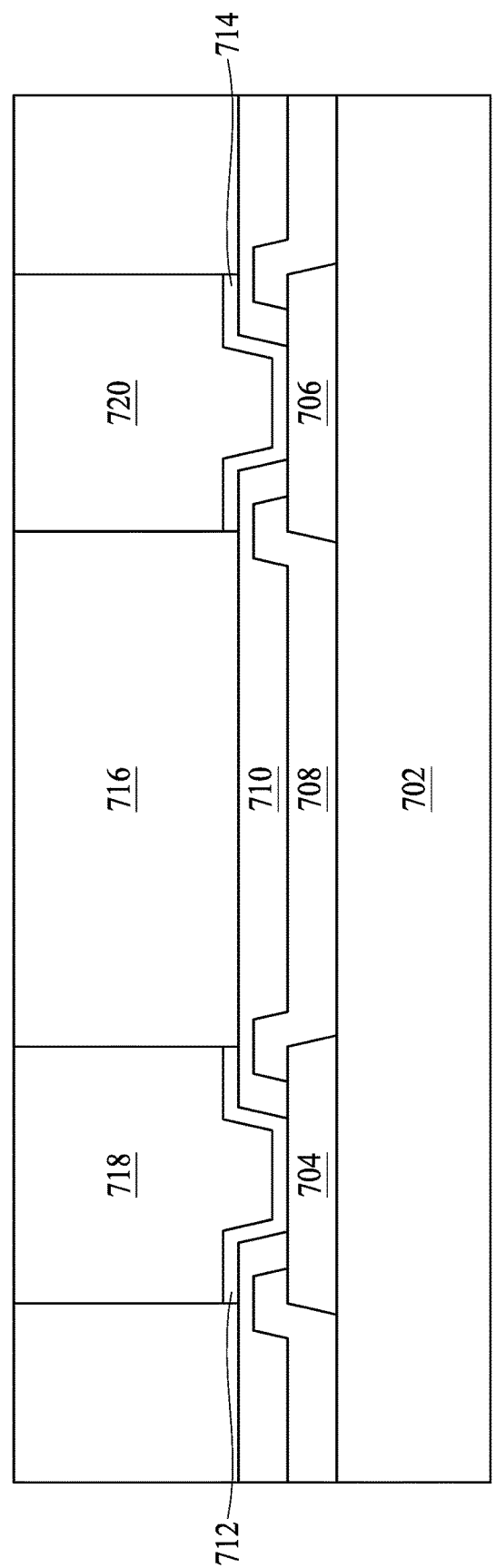

In FIG. 7C, copper (Cu) is deposited into the first trench and the second trench to form a first copper pillar 718 and a second copper pillar 720 respectively. In some embodiments, the first copper pillar 718 and the second copper pillar 720 have substantially the same height.

Figure 7D:
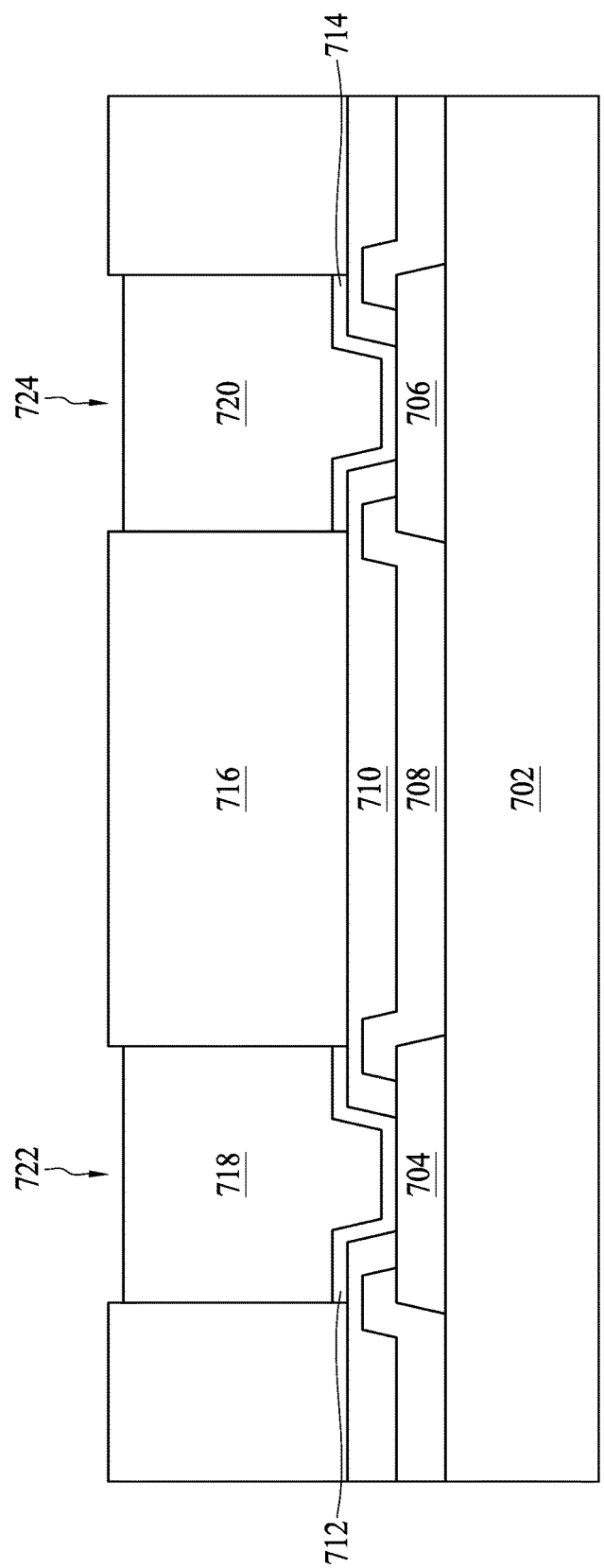

In FIG. 7D, the photoresist pattern 716 is formed to be higher than the first copper pillar 718 and the second copper pillar 720 to form a first trench 722 and a second trench 724.

Figure 7E:
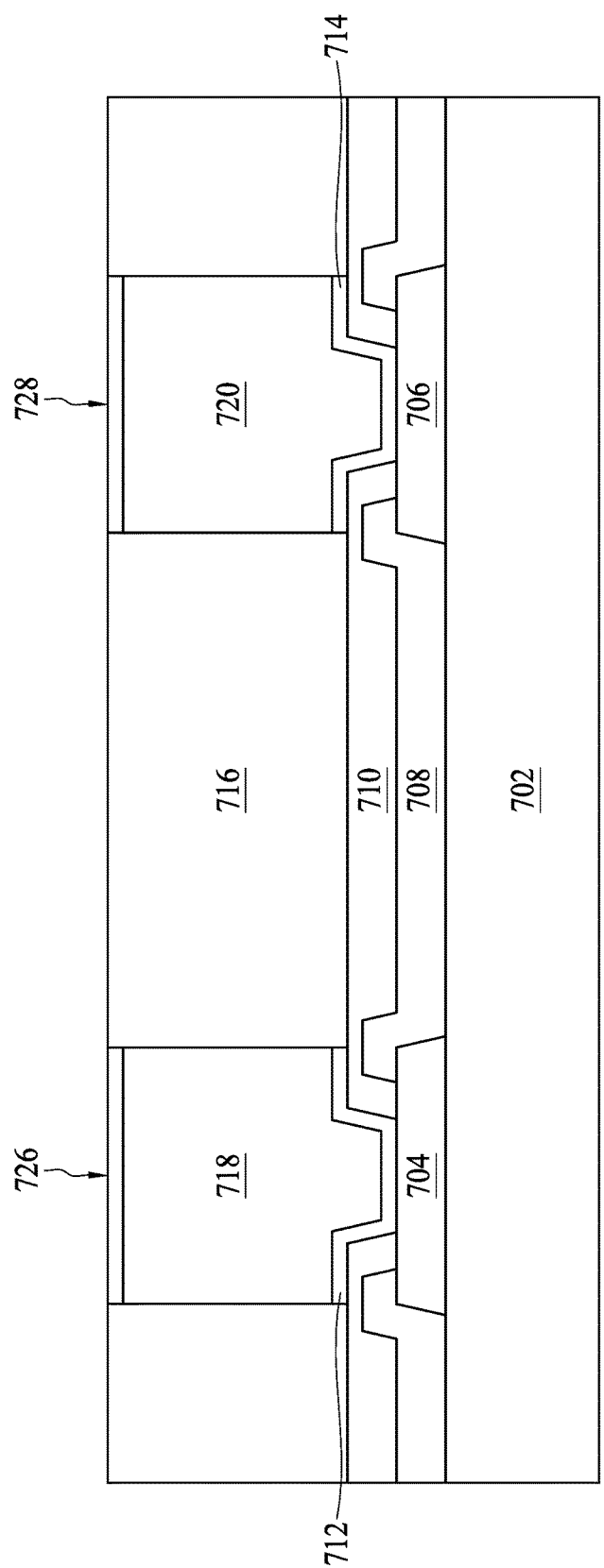

In FIG. 7E, nickel (Ni) is deposited into the first trench 722 and the second trench 724 to form a first nickel layer 726 and a second nickel layer 728 on the first copper pillar 718 and the second copper pillar 720 respectively.

Figure 7F:
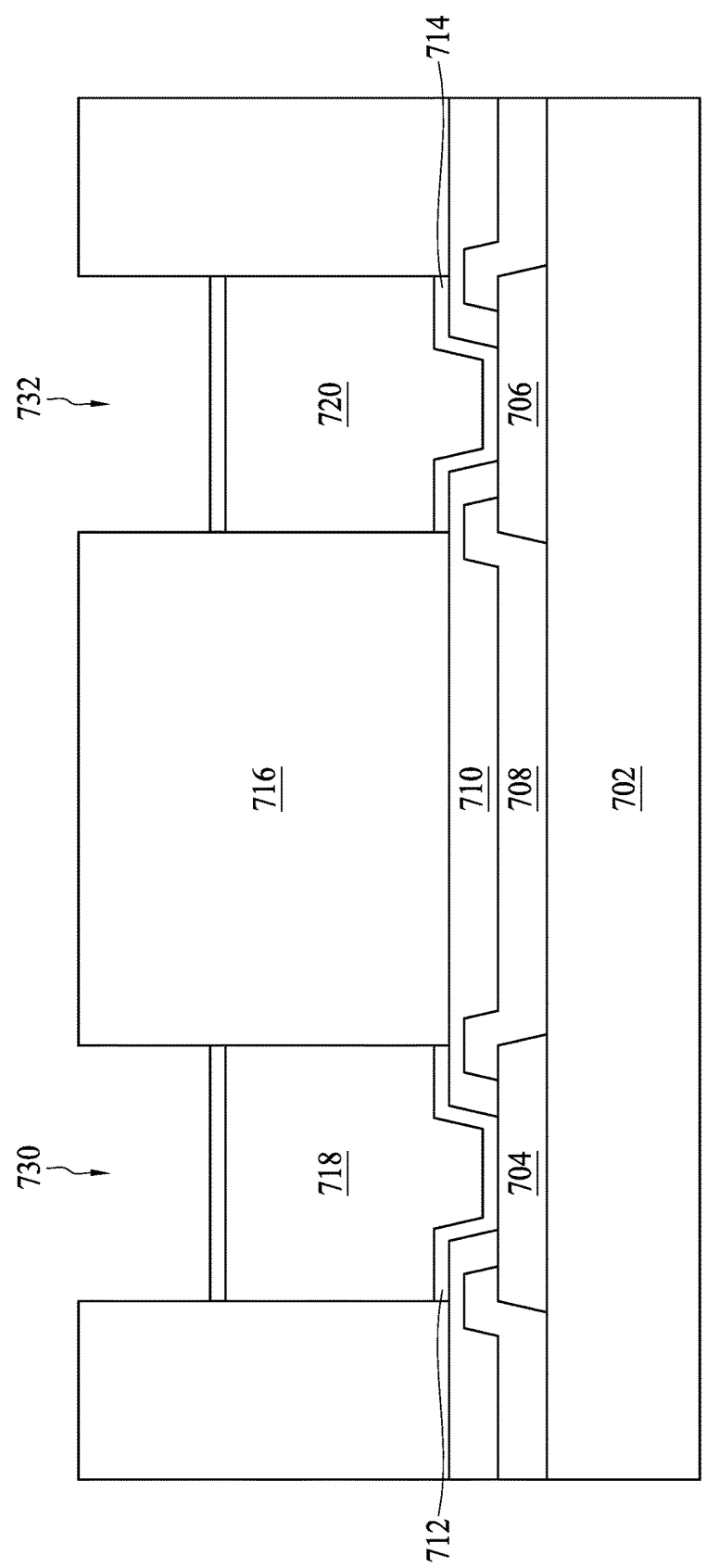

In FIG. 7F, the photoresist pattern 716 is formed to be higher than the first nickel layer 726 and the second nickel layer 728 to form a first trench 730 and a second trench 732. In some embodiments, the first trench 730 and the second trench 732 have substantially the same depth. However, this is not a limitation of the present disclosure. The first trench 730 and the second trench 732 may be designed to have different depths.

Figure 7G:
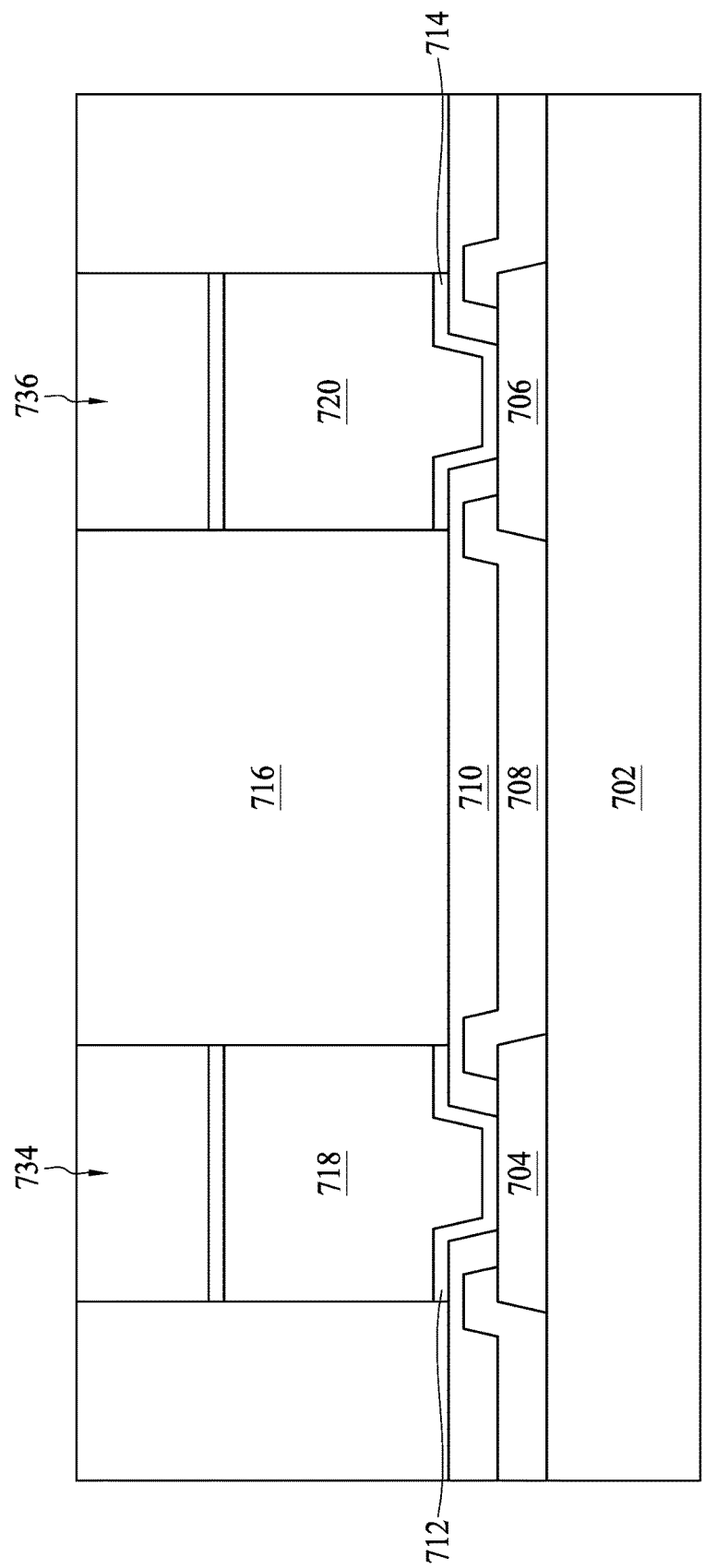

In FIG. 7G, solder is deposited into the first trench 730 and the second trench 732 to form a first solder pillar 734 and a second solder pillar 736 respectively. The first solder pillar 734 and the second solder pillar 736 may be formed by an electroplating operation. Moreover, during the electroplating operation, a current density may be controlled to be relatively small, and a relatively longer deposition time may be performed to form a good solder cap. After the electroplating operation, a relatively thin $SnO_2$ layer may be formed on a solder surface. However, the thickness of the $SnO_2$ layer is smaller than about 10 nm, which matches the assembly criteria and can be readily removed during a normal assembling process.

In some embodiments, the first solder pillar 734 and the second solder pillar 736 have substantially the same height. However, this is not a limitation of the present disclosure. The first solder pillar 734 and the second solder pillar 736 may have different heights depending on a warpage of the semiconductor substrate 700.

Figure 7H:
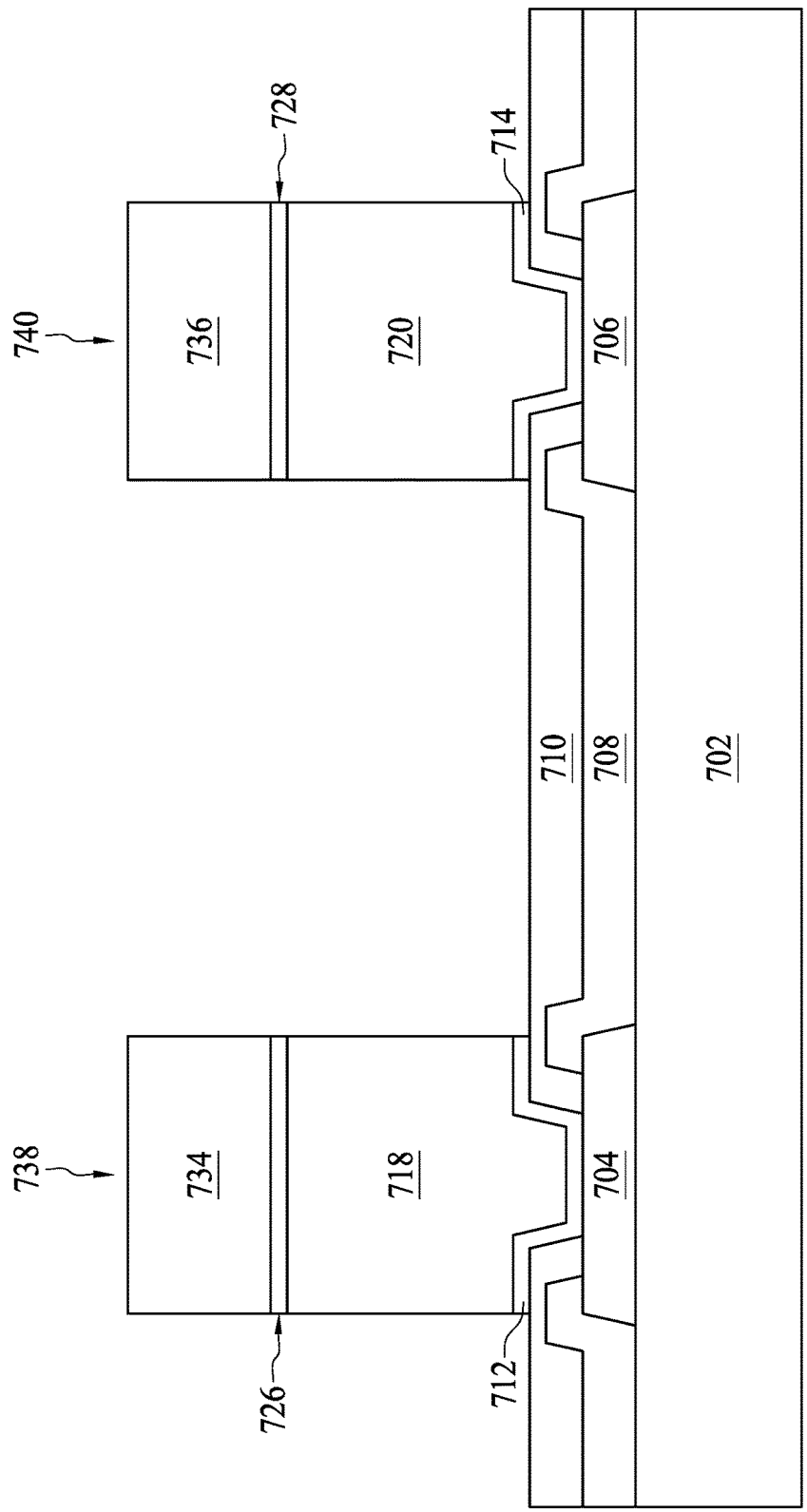

In FIG. 7H, the photoresist pattern 716 is removed to expose the insulation layer 710. Accordingly, a first conductive structure 738 (e.g., a first conductive bump) and a second conductive structure 740 (e.g., a second conductive bump) ready for assembly are formed, where the first conductive structure 738 comprises the first copper pillar 718, the first nickel layer 726, and the first solder pillar 734, and the second conductive structure 740 comprises the second copper pillar 720, the second nickel layer 728, and the second solder pillar 736. Specifically, a resulting semiconductor device package of FIG. 7H can be directly assembled with an external substrate without undergoing a reflow process. As the reflow process is not performed upon the first solder pillar 734 and the second solder pillar 736 before the assembling process, the first solder pillar 734 and the second solder pillar 736 are kept as pillar shapes when attaching to corresponding conductive pads of the external substrate as shown in FIG. 2.

It is noted that the above-mentioned semiconductor packaging assembly is an assembly of chip-to-substrate (C2S). However, this is not a limitation of the present disclosure. The similar concept may be applied in an assembly of chip-to-wafer (C2W), wafer-on-wafer (WoW), die stack, and interposer stack. The detailed description is omitted here for brevity.

Briefly, a semiconductor device package of some embodiments provides a plurality of pillar-shaped solders to compensate a warpage of a semiconductor substrate. Heights of the pillar-shaped solders can be appropriately controlled by a solder volume of the pillar-shaped solders. Therefore, a joining issue caused by the warpage of semiconductor substrate is solved. Moreover, the pillar-shaped solders are doped with an antioxidant to suppress the formation of stannic oxide. As the formation of stannic oxide is suppressed on surfaces of the pillar-shaped solders, the pillar-shaped solders are ready for joining with corresponding conductive pads on another semiconductor substrate, and a reflow operation can be omitted. Therefore, a manufacturing process flow of the semiconductor device package is simplified, and a cost of the semiconductor device package is reduced. Furthermore, as the reflow operation is omitted, a warpage issue of the semiconductor device package due to the reflow operation may be solved.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package ready for assembly, comprising:
    a semiconductor substrate;
    a first under-bump-metallurgy (UBM) layer disposed on the semiconductor substrate;
    a first conductive pillar disposed on the first UBM layer; and
    a second conductive pillar disposed on the first conductive pillar;
    wherein a material of the first conductive pillar is different from a material of the second conductive pillar, and the material of the second conductive pillar includes an antioxidant, and the first conductive pillar has a width, the second conductive pillar has a height, and the height is greater than the width by at least 0.65 times.

2. The semiconductor device package of claim 1, wherein the first conductive pillar is a copper pillar, and the second conductive pillar is a solder pillar including the antioxidant.

3. The semiconductor device package of claim 2, wherein a stannic oxide layer is formed on a surface of the second conductive pillar, and a thickness of the stannic oxide layer is less than 10 nm.

4. The semiconductor device package of claim 1, wherein the first conductive pillar has a first circumference, the second conductive pillar has a second circumference, and the second circumference is substantially equal to the first circumference.

5. The semiconductor device package of claim 4, wherein a lateral periphery of the first conductive pillar is aligned with a lateral periphery of the second conductive pillar.

6. The semiconductor device package of claim 1, further comprising:
    a second UBM layer disposed on the semiconductor substrate;
    a third conductive pillar disposed on the second UBM layer; and
    a fourth conductive pillar disposed on the third conductive pillar;
    wherein a material of the third conductive pillar is different from a material of the fourth conductive pillar, and the material of the fourth conductive pillar includes the antioxidant.

7. The semiconductor device package of claim 6, wherein the first conductive pillar and the third conductive pillar have substantially a same height, and the second conductive pillar and the fourth conductive pillar have different heights.

8. The semiconductor device package of claim 7, wherein the second conductive pillar is closer to a center of the semiconductor substrate than the fourth conductive pillar, and a height of the fourth conductive pillar is greater than a height of the second conductive pillar.

9. A semiconductor packaging assembly, comprising:
    a first semiconductor substrate;
    a first under-bump-metallurgy (UBM) layer disposed on the first semiconductor substrate;
    a first conductive pillar disposed on the first UBM layer;
    a second conductive pillar disposed on the first conductive pillar, wherein a material of the first conductive pillar is different from a material of the second conductive pillar;
    a second UBM layer disposed on the first semiconductor substrate;
    a third conductive pillar disposed on the second UBM layer;
    a fourth conductive pillar disposed on the third conductive pillar, wherein a material of the third conductive pillar is different from a material of the fourth conductive pillar;
    a second semiconductor substrate;
    a first conductive pad disposed on the second semiconductor substrate; and
    a second conductive pad disposed on the second semiconductor substrate;
    wherein the second conductive pillar is bonded to the first conductive pad, the fourth conductive pillar is bonded to the second conductive pad, and a volume of the material of the second conductive pillar is different from a volume of the material of the fourth conductive pillar, and the first conductive pillar and the third conductive pillar have substantially a same height, and the second conductive pillar and the fourth conductive pillar have different heights.

10. The semiconductor packaging assembly of claim 9, wherein the second conductive pillar is closer to a center of the first semiconductor substrate than the fourth conductive pillar, and the volume of the material of the fourth conductive pillar is greater than the volume of the material of the second conductive pillar.

11. The semiconductor packaging assembly of claim 9, wherein at least one of the second conductive pillar or the fourth conductive pillar includes an antioxidant.

12. A method of forming a semiconductor device package ready for assembly, the method comprising:
    forming a first under-bump-metallurgy (UBM) layer on a semiconductor substrate;
    forming a first conductive pillar on the first UBM layer; and
    forming a second conductive pillar on the first conductive pillar;
    wherein a material of the first conductive pillar is different from a material of the second conductive pillar, the second conductive pillar is ready to be assembled with a first conductive pad, the first conductive pillar has a width, the second conductive pillar has a height, and the height is greater than the width by at least 0.65 times.

13. The method of claim 12, wherein forming the second conductive pillar on the first conductive pillar comprises:
    providing an antioxidant in the material of the second conductive pillar.

14. The method of claim 12, wherein the first conductive pillar is a copper pillar, and the second conductive pillar is a solder pillar including an antioxidant.

15. The method of claim 12, wherein the width of the first conductive pillar is a first width, the second conductive pillar has a second width, and the second width is substantially equal to the first width.

16. The method of claim 12, further comprising:
    forming a second UBM layer on the semiconductor substrate;
    forming a third conductive pillar on the second UBM layer; and
    forming a fourth conductive pillar on the third conductive pillar;
    wherein a material of the third conductive pillar is different from a material of the fourth conductive pillar, and the fourth conductive pillar is ready to be assembled with a second conductive pad.

17. The method of claim 16, wherein the second conductive pillar is closer to a center of the semiconductor substrate than the fourth conductive pillar, and a height of the fourth conductive pillar is greater than the height of the second conductive pillar.

* * * * *